(12) United States Patent
Natarajan et al.

(10) Patent No.: US 11,119,672 B2
(45) Date of Patent: Sep. 14, 2021

(54) DYNAMIC SINGLE LEVEL CELL MEMORY CONTROLLER

(71) Applicant: Intel Corporation, Santa Clara, CA (US)

(72) Inventors: Shankar Natarajan, Folsom, CA (US); Suresh Nagarajan, Folsom, CA (US); Shivashekar Muralishankar, Folsom, CA (US); Sriram Natarajan, Folsom, CA (US); Yihua Zhang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/532,870

(22) Filed: Aug. 6, 2019

(65) Prior Publication Data

US 2020/0167089 A1 May 28, 2020

(51) Int. Cl.
*G06F 12/00* (2006.01)
*G06F 3/06* (2006.01)
*G11C 11/56* (2006.01)
*G06F 12/02* (2006.01)

(52) U.S. Cl.
CPC ............ *G06F 3/0634* (2013.01); *G06F 3/064* (2013.01); *G06F 3/0653* (2013.01); *G06F 3/0688* (2013.01); *G06F 12/0246* (2013.01); *G11C 11/5628* (2013.01)

(58) Field of Classification Search
CPC ...... G06F 3/0634; G06F 3/064; G06F 3/0653; G06F 3/0688; G06F 12/0246; G11C 11/5628
See application file for complete search history.

(56) References Cited

U.S. PATENT DOCUMENTS

| 10,229,735 | B1 | 3/2019 | Natarajan et al. | |
|---|---|---|---|---|
| 2019/0065080 | A1* | 2/2019 | Tanpairoj | G06F 3/061 |
| 2019/0065367 | A1* | 2/2019 | Li | G06F 12/0246 |
| 2020/0042223 | A1* | 2/2020 | Li | G06F 12/0246 |
| 2020/0142620 | A1* | 5/2020 | Yuan | G06F 3/0604 |
| 2021/0004158 | A1* | 1/2021 | Pletka | G06F 3/0685 |
| 2021/0141553 | A1* | 5/2021 | Yoo | G06F 3/0679 |

* cited by examiner

*Primary Examiner* — David Yi
*Assistant Examiner* — Tahilba O Puche
(74) *Attorney, Agent, or Firm* — Green, Howard & Mughal LLP.

(57) ABSTRACT

An embodiment of a memory controller device includes technology to control access to a memory array which includes a single-level cell region and a multi-level cell region, determine an amount of valid data in a dynamic portion of the single-level cell region at runtime, and adjust a size of the dynamic portion of the single-level cell region at runtime based on the determined amount of valid data in the dynamic portion of the single-level cell region. Other embodiments are disclosed and claimed.

14 Claims, 8 Drawing Sheets

DYNAMIC SINGLE LEVEL CELL MEMORY CONTROLLER

BACKGROUND

Single-level cell (SLC) buffers may include NAND-type flash memory (NAND memory) that is organized into multiple cells, with each cell containing one bit of data. Tri-level cell (TLC) memory may include NAND memory that is organized into multiple cells, with each cell containing three bits of data. Quad-level cell (QLC) memory may include NAND memory that is organized into multiple cells, with each cell containing four bits of data. The number of bits per cell may generally depend on how many distinct voltage levels used during program operation(s) associated with writing to, reading from and/or erasing the cell. Thus, in the case of TLC memory, to support three bits per cell, eight voltage levels may be used to distinguish between the eight possible combinations of ones and zeros (e.g., 000, 001, 010, 011, 100, 101, 110, 111) written to the cell.

Some memory systems include technology to determine a programmable eviction ratio associated with a storage device and convert a portion of a SLC region in the storage device into a multi-level cell (MLC) region in accordance with the programmable eviction ratio. MLC may include TLC (e.g., 3 bit or 8 level MLC), QLC (e.g., 4 bit or 16 level MLC), etc. For example, the amount of the portion converted into the MLC region varies gradually as a function of percent capacity filled in the storage device.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Methods, devices, systems, and articles are described herein related to storage systems. More particularly, some embodiments relate to an improved dynamic single level cell memory controller.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with nonvolatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
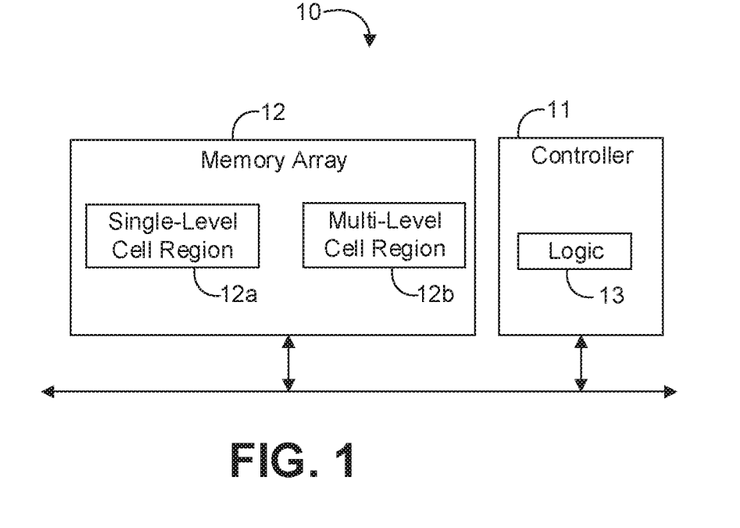
FIG. 1 is a block diagram of an example of a storage system according to an embodiment.

With reference to FIG. 1, an embodiment of a storage system 10 may include a memory array 12 including a SLC region 12a and a MLC region 12b, and a controller 11 coupled to the memory array 12. The controller 11 may include logic 13 to determine an amount of valid data in a dynamic portion of the SLC region 12a at runtime, and adjust a size of the dynamic portion of the SLC region 12a at runtime based on the determined amount of valid data in the dynamic portion of the SLC region 12a. In some embodiments, the logic 13 may be configured to increase the size of the dynamic portion in a first mode, maintain the size of the dynamic portion in a second mode, and decrease the size of the dynamic portion in a third mode. For example, the logic 13 may be further configured to determine if a first condition is attained where a number of super blocks in the dynamic portion of the SLC region 12a is equal to or greater than a first threshold, determine if a second condition is attained where an amount of mapped valid data in the dynamic portion of the SLC region 12a is equal to or greater than a second threshold, and determine if a third condition is attained where a number of empty blocks in the MLC region 12b is equal to or less than a third threshold.

In some embodiments, the logic 13 may be configured to operate in the first mode when none of the first condition, the second condition, or the third condition is attained, operate in the second mode when either the first condition or the second condition is attained and the third condition is not attained, and operate in the third mode when the third condition is attained. For example, the logic 13 may be configured to write all host data to the dynamic portion of the SLC region 12a in the first mode. The logic 13 may also be configured to write all host data to the dynamic portion of the SLC region 12a in the second mode, and perform a background move of copies of previously written data from the dynamic portion of the SLC region 12a to the MLC region 12b in the second mode. The logic 13 may also be configured to write all host data to a static portion of the SLC region 12a in the third mode, and perform a background move of copies of previously written data from both the static and dynamic portions of the SLC region 12a to the MLC region 12b in the third mode.

Embodiments of each of the above controller 11, memory array 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a microcontroller, a general purpose processor, a special purpose processor, a central processor unit (CPU), an execution unit, etc. In some embodiments, the memory array 12, and/or the logic 13 may be located in, or co-located with, various components, including the controller 11 (e.g., on a same die).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the memory array 12, other persistent storage media, or other system memory may store a set of instructions which when executed by the controller 11 cause the system 10 to implement one or more components, features, or aspects of the system 10 (e.g., the logic 13, determining the amount of valid data in a dynamic portion of the SLC region, adjusting the size of the dynamic portion based on the determined amount of valid data, etc.).

Figure 2:
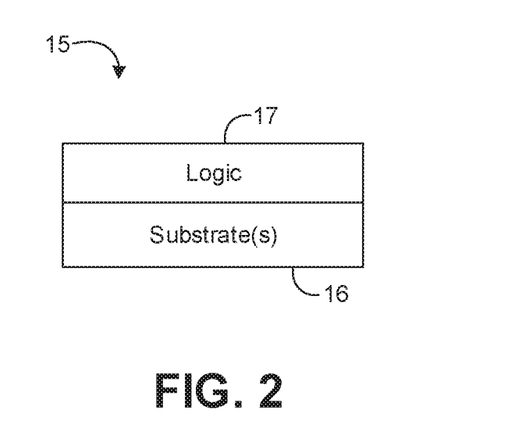
FIG. 2 is a block diagram of an example of an electronic apparatus according to an embodiment.
Figure 3A:
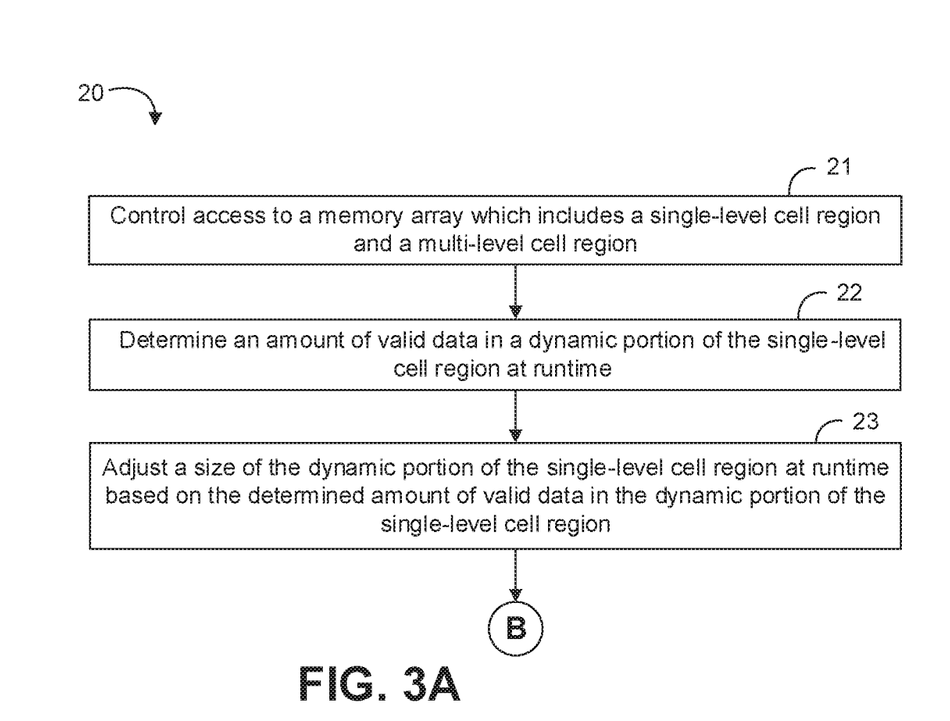
FIGS. 3A to 3E are flowcharts of an example of a method of controlling memory according to an embodiment.
Figure 3B:
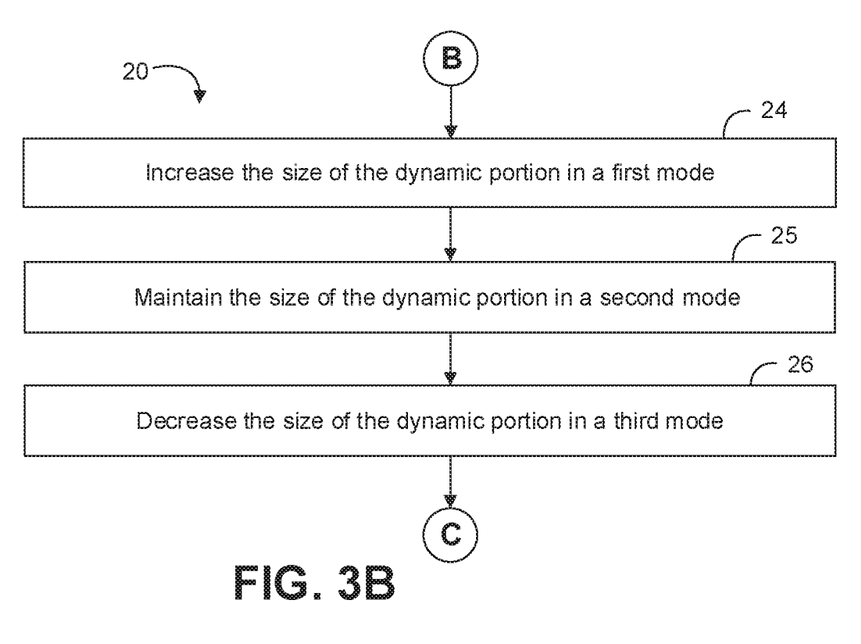
Figure 3C:
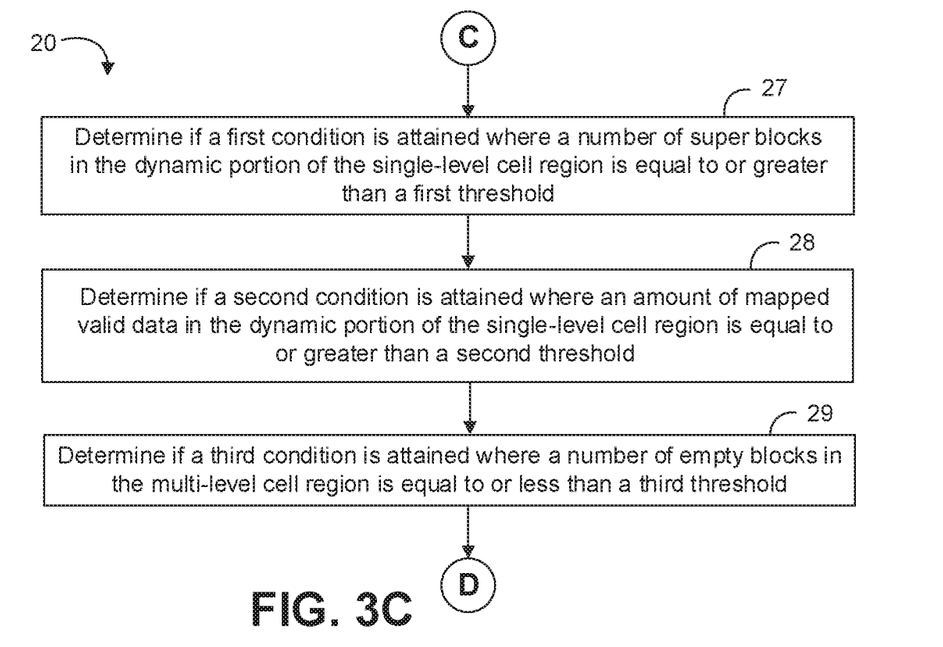
Figure 3D:
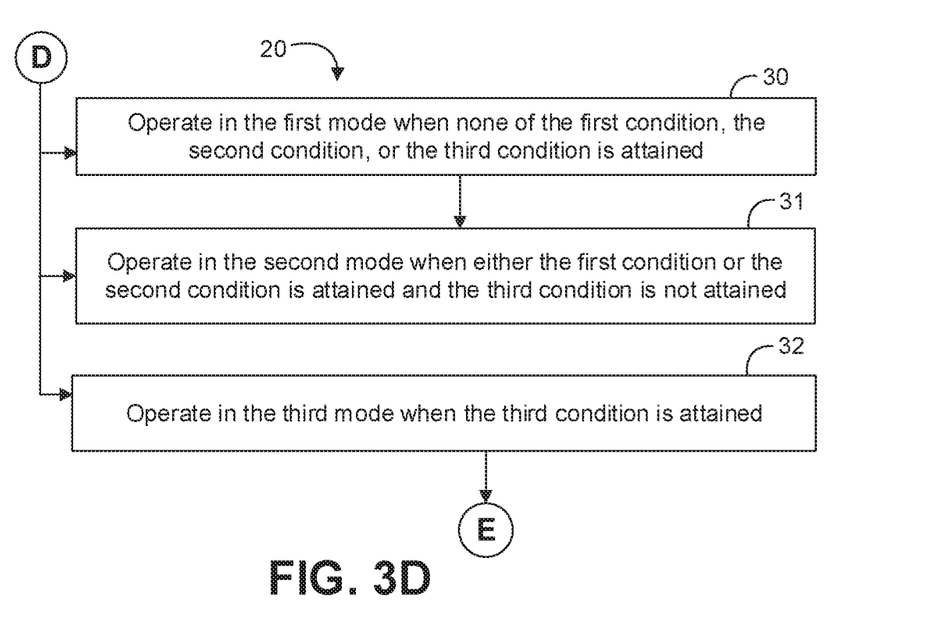
Figure 3E:
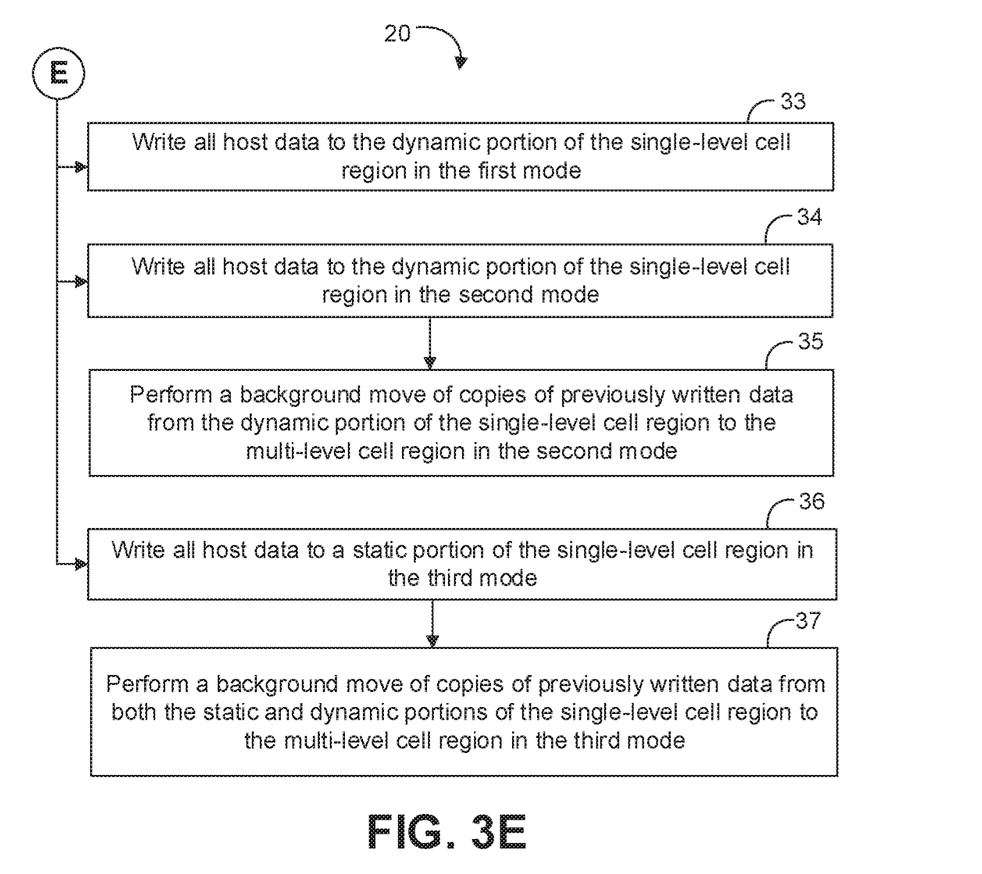

Turning now to FIG. 2, an embodiment of an electronic apparatus 15 may include one or more substrates 16, and logic 17 coupled to the one or more substrates 16. The logic 17 may be configured to control access to a memory array which includes a SLC region and a MLC region, determine an amount of valid data in a dynamic portion of the SLC region at runtime, and adjust a size of the dynamic portion of the SLC region at runtime based on the determined amount of valid data in the dynamic portion of the SLC region. In some embodiments, the logic 17 may be further configured to increase the size of the dynamic portion in a first mode, maintain the size of the dynamic portion in a second mode, and decrease the size of the dynamic portion in a third mode. For example, the logic 17 may be configured to determine if a first condition is attained where a number of super blocks in the dynamic portion of the SLC region is equal to or greater than a first threshold, determine if a second condition is attained where an amount of mapped valid data in the dynamic portion of the SLC region is equal to or greater than a second threshold, and determine if a third condition is attained where a number of empty blocks in the MLC region is equal to or less than a third threshold.

In some embodiments, the logic 17 may be further configured to operate in the first mode when none of the first condition, the second condition, or the third condition is attained, operate in the second mode when either the first condition or the second condition is attained and the third condition is not attained, and operate in the third mode when the third condition is attained. The logic 17 may also be configured to write all host data to the dynamic portion of the SLC region in the first mode. The logic 17 may also be configured to write all host data to the dynamic portion of the SLC region in the second mode, and perform a background move of copies of previously written data from the dynamic portion of the SLC region to the MLC region in the second mode. The logic 17 may also be configured to write all host data to a static portion of the SLC region in the third mode, and perform a background move of copies of previously written data from both the static and dynamic portions of the SLC region to the MLC region in the third mode.

Embodiments of the logic 17 may be implemented in a system, apparatus, computer, device, etc., for example, such as those described herein. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the logic 17 may be implemented on a semiconductor apparatus which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Turning now to FIGS. 3A to 3E, an embodiment of a method 20 of controlling memory may include controlling access to a memory array which includes a SLC region and a MLC region at block 21, determining an amount of valid data in a dynamic portion of the SLC region at runtime at block 22, and adjusting a size of the dynamic portion of the SLC region at runtime based on the determined amount of valid data in the dynamic portion of the SLC region at block 23. Some embodiments of the method 20 may further include increasing the size of the dynamic portion in a first mode at block 24, maintaining the size of the dynamic portion in a second mode at block 25, and decreasing the size of the dynamic portion in a third mode at block 26. For example, the method 20 may include determining if a first condition is attained where a number of super blocks in the dynamic portion of the SLC region is equal to or greater than a first threshold at block 27, determining if a second condition is attained where an amount of mapped valid data in the dynamic portion of the SLC region is equal to or greater than a second threshold at block 28, and determining if a third condition is attained where a number of empty blocks in the MLC region is equal to or less than a third threshold at block 29.

Some embodiments of the method 20 may further include operating in the first mode when none of the first condition, the second condition, or the third condition is attained at block 30, operating in the second mode when either the first condition or the second condition is attained and the third condition is not attained at block 31, and operating in the third mode when the third condition is attained at block 32. The method 20 may also include writing all host data to the dynamic portion of the SLC region in the first mode at block 33. The method 20 may also include writing all host data to the dynamic portion of the SLC region in the second mode at block 34, and performing a background move of copies of previously written data from the dynamic portion of the SLC region to the MLC region in the second mode at block 35. The method 20 may also include writing all host data to a static portion of the SLC region in the third mode at block 36, and performing a background move of copies of previously written data from both the static and dynamic portions of the SLC region to the MLC region in the third mode at block 37.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 20 may be implemented on a computer readable medium as described in connection with Examples 22 to 28 below. Embodiments or portions of the method 20 may be implemented in firmware, applications (e.g., through an application programming interface (API)), or driver software running on an operating system (OS).

Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Figure 4A:
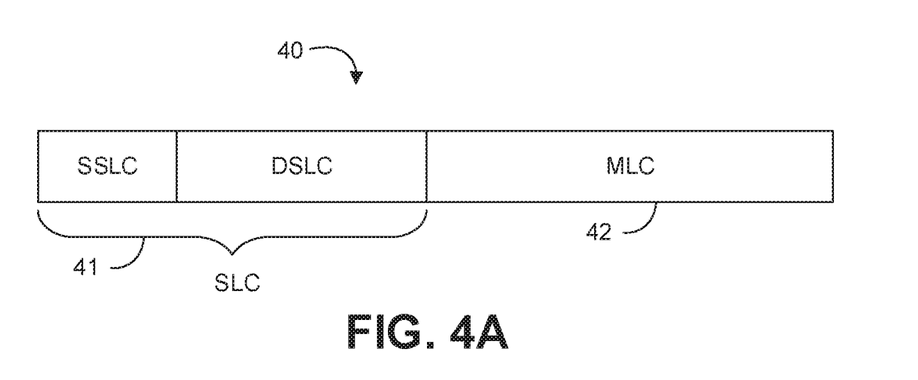
FIGS. 4A to 4C are illustrative diagrams of an example of a memory which includes a dynamic SLC portion according to an embodiment.
Figure 4B:
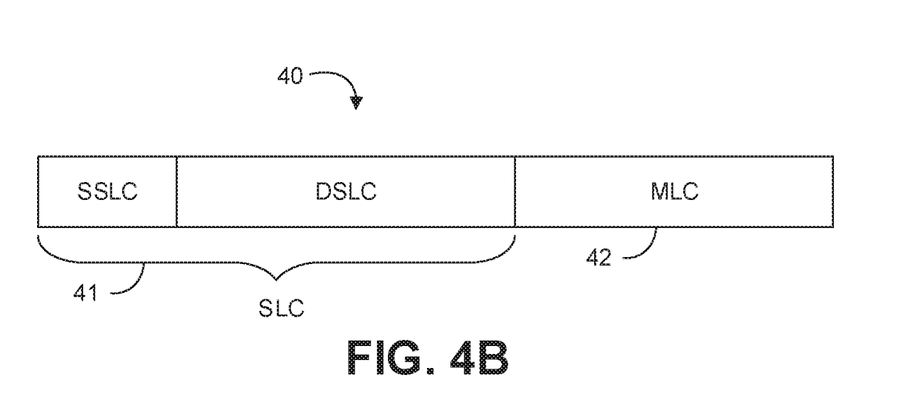
Figure 4C:
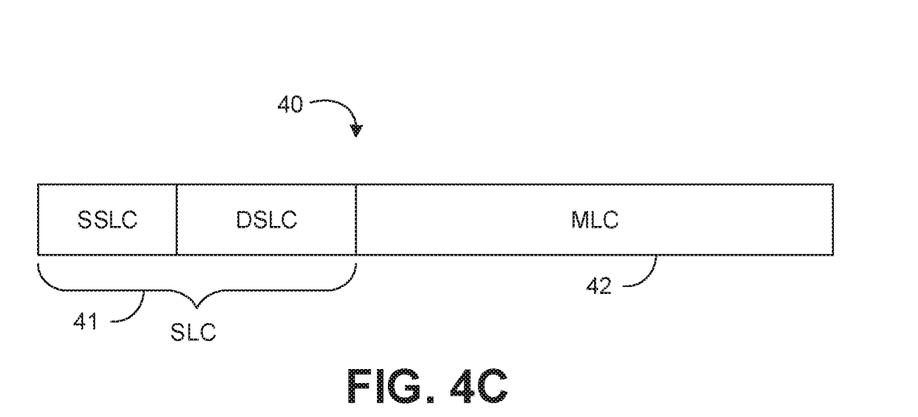

Turning now to FIGS. 4A to 4C, an embodiment of a memory device 40 may include a SLC region 41 and a MLC region 42. The SLC region 41 may include a static SLC (SSLC) portion and a dynamic SLC (DSLC) portion. FIG. 4A shows a nominal baseline configuration, while FIG. 4B shows an increased size of the DSLC portion relative to the baseline and FIG. 4C shows a decreased size of the DSLC portion relative to the baseline. In some embodiments, the increase/decrease may only refer to the number of blocks while the actual valid data size remains the same. For example, the memory device 40 may include memory technology which supports multiple voltage levels to represent multiple bits of data (e.g., SLC, dual-level cell, TLC, quad-level cell (QLC), etc.). The memory technology may be organized in blocks which may be configured at runtime to a desired number of bits/voltage levels. For example, a block of the memory device may be configured to be either a SLC block or a MLC block (e.g., TLC, QLC, etc.). At runtime, a block which is currently configured to be a SLC block may be converted to be a MLC block. Conversely, a block which is currently configured to be a MLC block may be converted at runtime to be a SLC block. Accordingly, the respective sizes of the SLC region 41 and MLC region 42 may be adjusted at runtime, although in some implementations it may be desirable to maintain some minimum amount of SSLC memory as well as some minimum amount of MLC memory capacity.

Converting memory blocks in the MLC region 42 into memory blocks in the DSLC region involves reducing the number of distinct voltage levels used to program the converted memory blocks, which in turn reduces the capacity and increases the speed at which the converted blocks can be programmed. Accordingly, such conversion may improve the write bandwidth of the DSLC portion. The DSLC portion along with MLC region 42 may belong to a user-accessible logical block address (LBA) range, while the SSLC may reside outside the user-accessible LBA range. Converting memory blocks in the DSLC region into memory blocks in the MLC region 42 involves increasing the number of distinct voltage levels used to program the converted memory blocks, which in turn increases the capacity and decreases the speed at which the converted blocks can be programmed. For example, the conversion process may be performed by utilizing appropriate operation codes (e.g., OP codes) or feature set that can put the entire NAND die in a SLC or a MLC mode. The firmware identifies the target block and target mode. The firmware first converts the NAND die to the target mode and the issues a specific operation (e.g., erase, program or read) to the target block. The conversion process may be performed for every targeted block and the firmware maintains the target mode for every targeted block.

Some embodiments may advantageously provide an improved or optimized dynamic SLC buffer. TLC/QLC memory, for example, may be about five to ten times slower in burst-writes as compared to SLC memory (e.g., in a SSD device). When utilizing SLC memory as an intermediate buffer (e.g., an SLC-first configuration), the sustained performance may still show low bandwidth when the SLC buffer becomes full. One example of a dynamic SLC buffer may utilize SSD block management technology to dynamically switch a block between SLC and TLC/QLC and extend the SLC region which maintains high performance longer for some workloads (e.g., including sequential write workloads). Some embodiments may advantageously improve performance of a dynamic SLC buffer for a wider variety of workloads, including random workloads.

For example, conventional block management technology for a dynamic SLC buffer works well for sequential write workloads but not as well for varying random write spans because DSLC size may be adjusted purely as a factor of blocks (e.g., which may prematurely terminate the DSLC performance boost after a predefined number of blocks have been consumed). Some embodiments may advantageously add a check for the total valid data in the DSLC buffer to exploit the invalidation of data during random writes. Some embodiments may change the size of the DSLC buffer as a factor of valid data in the DSLC buffer instead of block based sizing (e.g., which utilizes the natural invalidation in random writes without impacting the sequential write performance). Advantageously, some embodiments substantially increase random write performance.

Some embodiments may nominally define three modes for different operating characteristics of a DSLC buffer, including a grow mode, a stay mode, and a shrink mode. The size of the DSLC buffer may be increased in the grow mode. For example, in the grow mode all host data is written to the DSLC buffer and there is no background data move (e.g., converting QLC blocks to DSLC blocks as needed). The grow mode may provide higher or maximum performance. The size of the DSLC buffer may be substantially maintained at its current size in the stay mode. For example, in the stay mode all host data is written to the DSLC buffer and there is also a background move that copies previously written data from DSLC to QLC. For example, as the host writes to four (4) new DSLC blocks, firmware moves data from four (4) other DSLC blocks to a new QLC block (e.g., the move ratio between host writes to background moves is substantially 1:1 in the stay mode). The size of the DLSC buffer may be decreased in the shrink mode. For example, in the shrink mode all host data is written to the SSLC portion and there is also a background data move that copies previously written SSLC and one DSLC block to QLC (e.g., an older DSLC block converted to a new QLC block). For example, as the host writes to three (3) SSLC blocks, firmware moves data from three (3) other SSLC blocks and one (1) DSLC block to a new QLC block (e.g., the move ratio between host writes to background moves is 3:4 in the shrink mode).

Some embodiments may provide two or more user inputs for controlling size management of the DSLC buffer, including a maximum DSLC percentage and a maximum DSLC sector count. The maximum DSLC percentage refers to the percentage of QLC empty blocks that can be used as DSLC. The user setting for the maximum DSLC percentage allows the user to modulate the shrink mode duration. The maximum DSLC sector count refers to the maximum DSLC size in terms of valid data. The user setting for the maximum DSLC sector count allows the user to modulate the grow mode duration.

Figure 5:
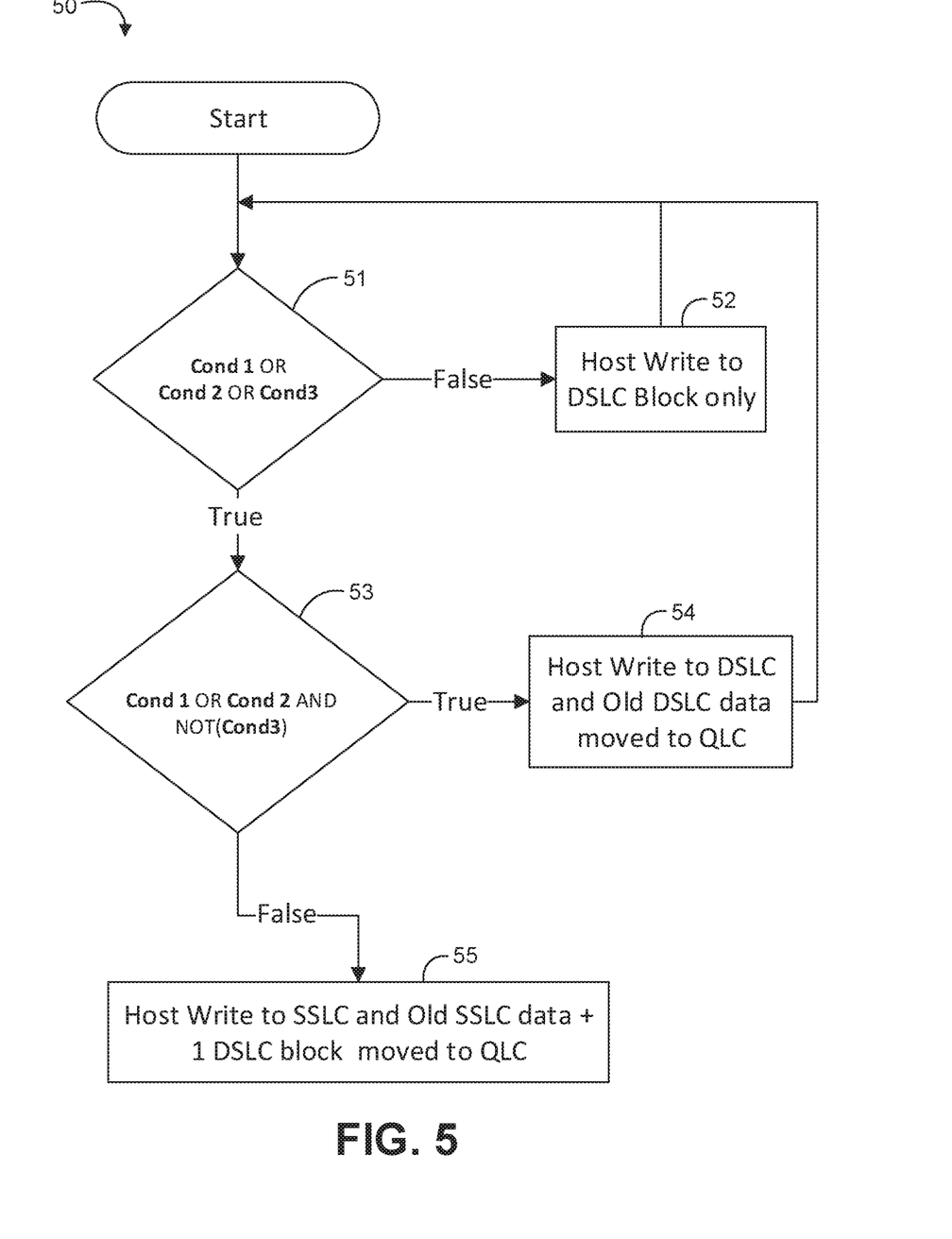
FIG. 5 is a flowchart of an example of another method of controlling memory according to an embodiment.

With reference to FIG. 5, an embodiment of a method 50 of controlling memory may including determining if any of a first condition (Cond 1), a second condition (Cond 2), or a third condition (Cond 3) is attained at block 51. For example, operation of the DLSC buffer may be in accordance with the following governing conditions:

Cond 1: Number of DSLC super blocks reaches MaxDSLC;

Cond 2: Maximum valid data (mapped) of DSLC reaches MaxDslcValidity; and

Cond 3: Total number of QLC empty blocks reaches AbsDslcCNT, where:

MaxDSLC corresponds to a threshold representing the maximum DSLC percentage user setting (e.g., total number of empty QLC blocks including over provisioning blocks);

MaxDslcValidity corresponds to a threshold representing the maximum DSLC sector count user setting;

AbsDslcCnt: A minimum number of DSLC blocks required to hold MaxDslcValidity of valid user data Super Block: The physical storage media is a collection of dies that are capable of storage. A collection of storage dies that can be read/written/erased in parallel may be referred to as a super block.

The method 50 may operate in a runtime grow mode when ((Cond 1 OR Cond 2 OR Cond3) is not hit) at block 51, and perform host write requests to DSLC blocks only at block 52. Otherwise, the method 50 may operate in a runtime stay mode when either ((Cond 1 OR Cond 2) is hit AND Cond 3 is not hit) at block 53, and perform host writes to DSLC blocks and move old DLSC data to QLC at block 54. Otherwise, the method 50 may operate in a runtime shrink mode and perform host writes to SSLC blocks and mode old SSLC data and one DSLC block to QLC at block 55. For example, the method 50 may operate in the shrink mode when Cond 3 is hit OR when DSLC max erase count is reached (e.g., corresponding to a permanent DSLC disable).

As compared to conventional block management technology for a DLSC buffer, some embodiments of a SSD utilizing the method 50 may advantageously improve performance for random write workloads.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 6:
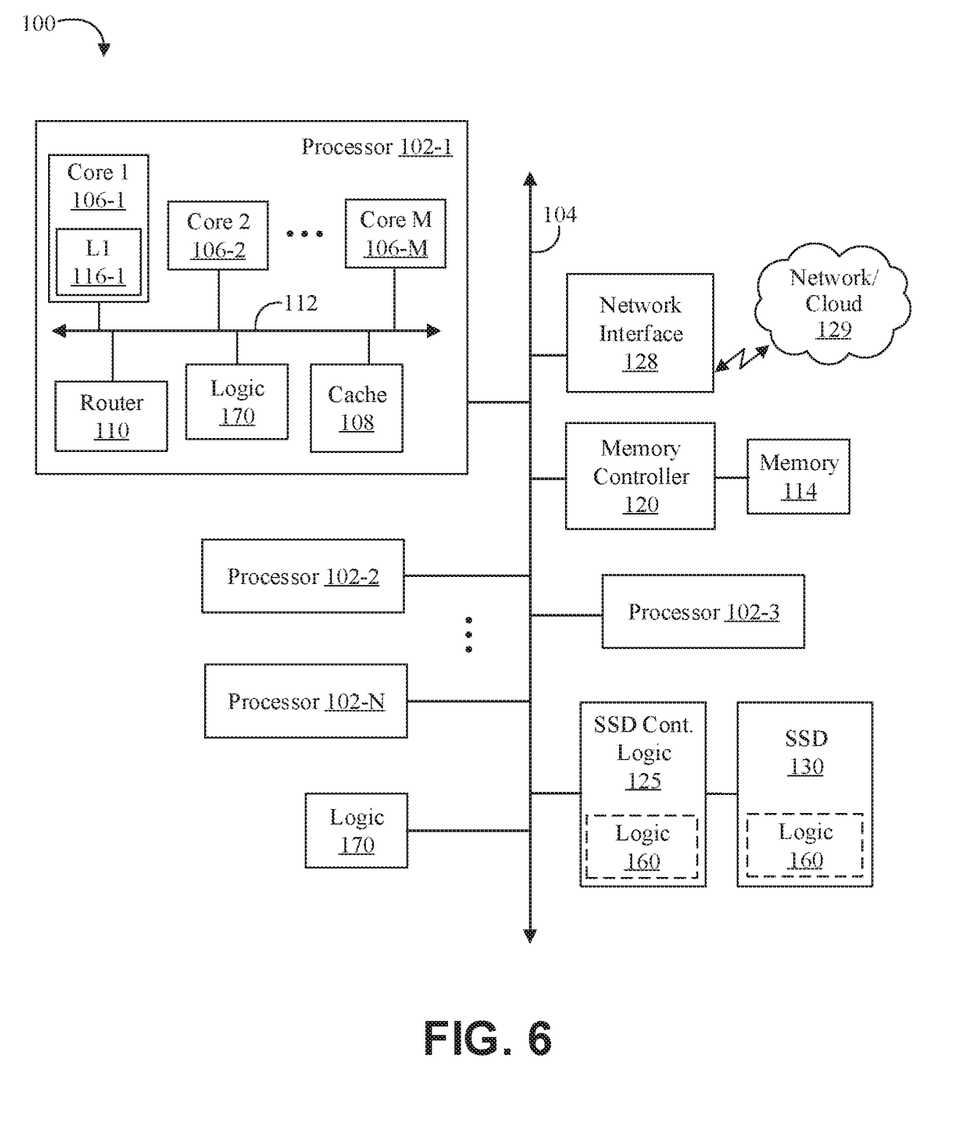
FIG. 6 is a block diagram of an example of a computing system according to an embodiment.

Turning now to FIG. 6, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 6, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 6, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD device 130 coupled to the interconnect 104 via SSD controller logic 125. Hence, logic 125 may control access by various components of system 100 to the SSD device 130. Furthermore, even though logic 125 is shown to be directly coupled to the interconnection 104 in FIG. 6, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc.) Additionally, logic 125 may be incorporated into memory controller logic (such as those discussed with reference to FIG. 7) or provided on a same integrated circuit (IC) device in various embodiments (e.g., on the same circuit board device as the SSD device 130 or in the same enclosure as the SSD device 130).

Furthermore, logic 125 and/or SSD device 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD device 130, SSD bus, SATA bus, logic 125, logic 160, logic 170, etc., to sense variations in various factors affecting power/thermal behavior of the system/platform, such as temperature, operating frequency, operating voltage, power consumption, and/or inter-core communication activity, etc.

Figure 7:
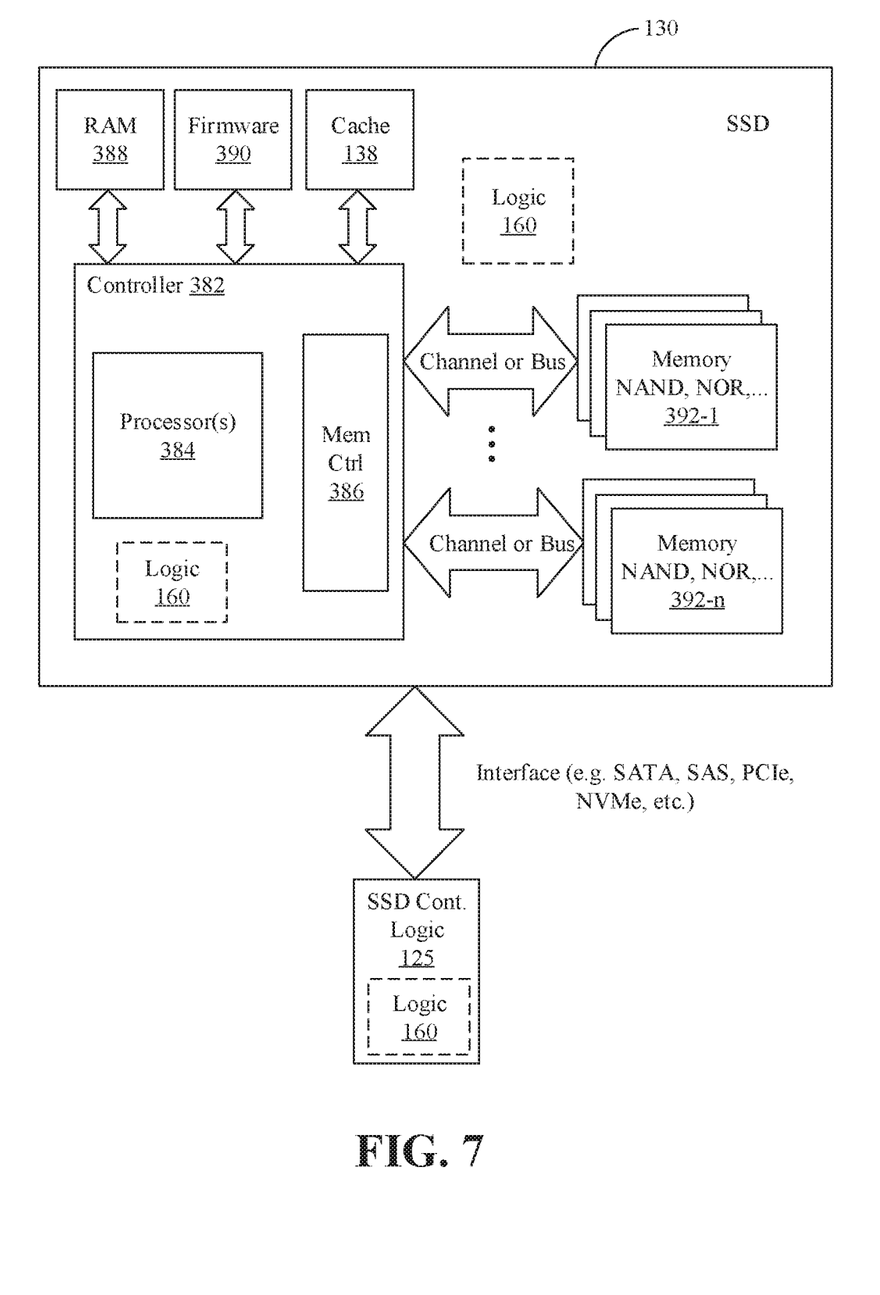
FIG. 7 is a block diagram of an example of a solid-state drive (SSD) according to an embodiment.

FIG. 7 illustrates a block diagram of various components of the SSD device 130, according to an embodiment. As illustrated in FIG. 7, logic 160 may be located in various locations such as inside the SSD device 130 or controller 382, etc., and may include similar technology as discussed in connection with FIG. 6. The SSD device 130 includes a controller 382 (which in turn includes one or more processor cores or processors 384 and memory controller logic 386), cache 138, RAM 388, firmware storage 390, and one or more memory devices 392-1 to 392-N (collectively memory 392, which may include NAND flash, NOR flash, or other types of non-volatile memory). The memory 392 is coupled to the memory controller logic 386 via one or more memory channels or busses. Also, SSD device 130 communicates with logic 125 via an interface (such as a SATA, SAS, PCIe, NVMe, etc., interface). One or more of the features/aspects/ operations discussed with reference to FIGS. 1-5 may be performed by one or more of the components of FIG. 7. Processors 384 and/or controller 382 may compress/decompress (or otherwise cause compression/decompression of) data written to or read from memory devices 392-1 to 392-N. Also, one or more of the features/aspects/operations of FIGS. 1-5 may be programmed into the firmware 390. Further, SSD controller logic 125 may also include logic 160.

As illustrated in FIGS. 6 and 7, the SSD device 130 may include logic 160, which may be in the same enclosure as the SSD device 130 and/or fully integrated on a printed circuit board (PCB) of the SSD device 130. The system 100 may include further logic 170 outside of the SSD device 130. Advantageously, the logic 160 and/or logic 170 may include technology to implement one or more aspects of the method 20 (FIGS. 3A to 3E), the method 50 (FIG. 5), the system 10, the apparatus 15, and/or any of the features discussed herein. For example, the logic 170 may include technology to implement the host device/computer system/agent aspects of the various embodiments described herein (e.g., requesting information from the SSD device 130, sending information to the SSD device 130, initiating a firmware update of one or more of the SSDs 392, etc.). For example, the memory 392 may include a SLC region and a MLC region the logic 160 may include technology to control access to the memory 392, determine an amount of valid data in a dynamic portion of the SLC region at runtime, and adjust a size of the dynamic portion of the SLC region at runtime based on the determined amount of valid data in the dynamic portion of the SLC region. In some embodiments, the logic 160 may be further configured to increase the size of the dynamic portion in a first mode, maintain the size of the dynamic portion in a second mode, and decrease the size of the dynamic portion in a third mode. For example, the logic 160 may be configured to determine if a first condition is attained where a number of super blocks in the dynamic portion of the SLC region is equal to or greater than a first threshold, determine if a second condition is attained where an amount of mapped valid data in the dynamic portion of the SLC region is equal to or greater than a second threshold, and determine if a third condition is attained where a number of empty blocks in the MLC region is equal to or less than a third threshold.

In some embodiments, the logic 160 may be further configured to operate in the first mode when none of the first condition, the second condition, or the third condition is attained, operate in the second mode when either the first condition or the second condition is attained and the third condition is not attained, and operate in the third mode when the third condition is attained. The logic 160 may also be configured to write all host data to the dynamic portion of the SLC region in the first mode. The logic 160 may also be configured to write all host data to the dynamic portion of the SLC region in the second mode, and perform a background move of copies of previously written data from the dynamic portion of the SLC region to the MLC region in the second mode. The logic 160 may also be configured to write all host data to a static portion of the SLC region in the third mode, and perform a background move of copies of previously written data from both the static and dynamic portions of the SLC region to the MLC region in the third mode.

In other embodiments, the SSD device 130 may be replaced with any suitable storage/memory technology/media. In some embodiments, the logic 160/170 may be coupled to one or more substrates (e.g., silicon, sapphire, gallium arsenide, printed circuit board (PCB), etc.), and may include transistor channel regions that are positioned within the one or more substrates. In other embodiments, the SSD device 130 may include two or more types of storage media. For example, the bulk of the storage may be NAND and may further include some faster, smaller granularity accessible (e.g., byte-addressable) NVM such as INTEL 3DXP media. The SSD device 130 may alternatively, or additionally, include persistent volatile memory (e.g., battery or capacitor backed-up DRAM or SRAM). For example, the SSD device 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIG. 6, features or aspects of the logic 160 and/or the logic 170 may be distributed throughout the system 100, and/or co-located/ integrated with various components of the system 100.

Additional Notes and Examples

Example 1 includes an electronic apparatus, comprising one or more substrates, and logic coupled to the one or more substrates, the logic to control access to a memory array which includes a single-level cell region and a multi-level cell region, determine an amount of valid data in a dynamic portion of the single-level cell region at runtime, and adjust a size of the dynamic portion of the single-level cell region at runtime based on the determined amount of valid data in the dynamic portion of the single-level cell region.

Example 2 includes the apparatus of Example 1, wherein the logic is further to increase the size of the dynamic portion in a first mode, maintain the size of the dynamic portion in a second mode, and decrease the size of the dynamic portion in a third mode.

Example 3 includes the apparatus of Example 2, wherein the logic is further to determine if a first condition is attained where a number of super blocks in the dynamic portion of the single-level cell region is equal to or greater than a first threshold, determine if a second condition is attained where an amount of mapped valid data in the dynamic portion of the single-level cell region is equal to or greater than a second threshold, and determine if a third condition is attained where a number of empty blocks in the multi-level cell region is equal to or less than a third threshold.

Example 4 includes the apparatus of Example 3, wherein the logic is further to operate in the first mode when none of the first condition, the second condition, or the third condition is attained, operate in the second mode when either the first condition or the second condition is attained and the third condition is not attained, and operate in the third mode when the third condition is attained.

Example 5 includes the apparatus of any of Examples 2 to 4, wherein the logic is further to write all host data to the dynamic portion of the single-level cell region in the first mode.

Example 6 includes the apparatus of any of Examples 2 to 5, wherein the logic is further to write all host data to the dynamic portion of the single-level cell region in the second mode, and perform a background move of copies of previously written data from the dynamic portion of the single-level cell region to the multi-level cell region in the second mode.

Example 7 includes the apparatus of any of Examples 2 to 6, wherein the logic is further to write all host data to a static portion of the single-level cell region in the third mode, and perform a background move of copies of previously written data from both the static and dynamic portions of the single-level cell region to the multi-level cell region in the third mode.

Example 8 includes a storage system, comprising a memory array including a single-level cell region and a multi-level cell region, and a controller coupled to the memory array, the controller including logic to determine an amount of valid data in a dynamic portion of the single-level cell region at runtime, and adjust a size of the dynamic portion of the single-level cell region at runtime based on the determined amount of valid data in the dynamic portion of the single-level cell region.

Example 9 includes the system of Example 8, wherein the logic is further to increase the size of the dynamic portion in a first mode, maintain the size of the dynamic portion in a second mode, and decrease the size of the dynamic portion in a third mode.

Example 10 includes the system of Example 9, wherein the logic is further to determine if a first condition is attained where a number of super blocks in the dynamic portion of the single-level cell region is equal to or greater than a first threshold, determine if a second condition is attained where an amount of mapped valid data in the dynamic portion of the single-level cell region is equal to or greater than a second threshold, and determine if a third condition is attained where a number of empty blocks in the multi-level cell region is equal to or less than a third threshold.

Example 11 includes the system of Example 10, wherein the logic is further to operate in the first mode when none of the first condition, the second condition, or the third condition is attained, operate in the second mode when either the first condition or the second condition is attained and the third condition is not attained, and operate in the third mode when the third condition is attained.

Example 12 includes the system of any of Examples 9 to 11, wherein the logic is further to write all host data to the dynamic portion of the single-level cell region in the first mode.

Example 13 includes the system of any of Examples 9 to 12, wherein the logic is further to write all host data to the dynamic portion of the single-level cell region in the second mode, and perform a background move of copies of previously written data from the dynamic portion of the single-level cell region to the multi-level cell region in the second mode.

Example 14 includes the system of any of Examples 9 to 13, wherein the logic is further to write all host data to a static portion of the single-level cell region in the third mode, and perform a background move of copies of previously written data from both the static and dynamic portions of the single-level cell region to the multi-level cell region in the third mode.

Example 15 includes a method of controlling memory, comprising controlling access to a memory array which includes a single-level cell region and a multi-level cell region, determining an amount of valid data in a dynamic portion of the single-level cell region at runtime, and adjusting a size of the dynamic portion of the single-level cell region at runtime based on the determined amount of valid data in the dynamic portion of the single-level cell region.

Example 16 includes the method of Example 15, further comprising increasing the size of the dynamic portion in a first mode, maintaining the size of the dynamic portion in a second mode, and decreasing the size of the dynamic portion in a third mode.

Example 17 includes the method of Example 16, further comprising determining if a first condition is attained where a number of super blocks in the dynamic portion of the single-level cell region is equal to or greater than a first threshold, determining if a second condition is attained where an amount of mapped valid data in the dynamic portion of the single-level cell region is equal to or greater than a second threshold, and determining if a third condition is attained where a number of empty blocks in the multi-level cell region is equal to or less than a third threshold.

Example 18 includes the method of Example 17, further comprising operating in the first mode when none of the first condition, the second condition, or the third condition is attained, operating in the second mode when either the first condition or the second condition is attained and the third condition is not attained, and operating in the third mode when the third condition is attained.

Example 19 includes the method of any of Examples 16 to 18, further comprising writing all host data to the dynamic portion of the single-level cell region in the first mode.

Example 20 includes the method of any of Examples 16 to 19, further comprising writing all host data to the dynamic portion of the single-level cell region in the second mode, and performing a background move of copies of previously written data from the dynamic portion of the single-level cell region to the multi-level cell region in the second mode.

Example 21 includes the method of any of Examples 16 to 20, further comprising writing all host data to a static portion of the single-level cell region in the third mode, and performing a background move of copies of previously written data from both the static and dynamic portions of the single-level cell region to the multi-level cell region in the third mode.

Example 22 includes at least one non-transitory machine readable medium comprising a plurality of instructions that, in response to being executed on a computing device, cause the computing device to control access to a memory array which includes a single-level cell region and a multi-level cell region, determine an amount of valid data in a dynamic portion of the single-level cell region at runtime, and adjust a size of the dynamic portion of the single-level cell region at runtime based on the determined amount of valid data in the dynamic portion of the single-level cell region.

Example 23 includes the machine readable medium of Example 22, comprising a plurality of further instructions that, in response to being executed on the computing device, cause the computing device to increase the size of the dynamic portion in a first mode, maintain the size of the dynamic portion in a second mode, and decrease the size of the dynamic portion in a third mode.

Example 24 includes the machine readable medium of Example 23, comprising a plurality of further instructions that, in response to being executed on the computing device, cause the computing device to determine if a first condition is attained where a number of super blocks in the dynamic portion of the single-level cell region is equal to or greater than a first threshold, determine if a second condition is attained where an amount of mapped valid data in the dynamic portion of the single-level cell region is equal to or greater than a second threshold, and determine if a third condition is attained where a number of empty blocks in the multi-level cell region is equal to or less than a third threshold.

Example 25 includes the machine readable medium of Example 24, comprising a plurality of further instructions that, in response to being executed on the computing device, cause the computing device to operate in the first mode when none of the first condition, the second condition, or the third condition is attained, operate in the second mode when either the first condition or the second condition is attained and the third condition is not attained, and operate in the third mode when the third condition is attained.

Example 26 includes the machine readable medium of any of Examples 23 to 25, comprising a plurality of further instructions that, in response to being executed on the computing device, cause the computing device to write all host data to the dynamic portion of the single-level cell region in the first mode.

Example 27 includes the machine readable medium of any of Examples 23 to 26, comprising a plurality of further instructions that, in response to being executed on the computing device, cause the computing device to write all host data to the dynamic portion of the single-level cell region in the second mode, and perform a background move of copies of previously written data from the dynamic portion of the single-level cell region to the multi-level cell region in the second mode.

Example 28 includes the machine readable medium of any of Examples 23 to 27, comprising a plurality of further instructions that, in response to being executed on the computing device, cause the computing device to write all host data to a static portion of the single-level cell region in the third mode, and perform a background move of copies of previously written data from both the static and dynamic portions of the single-level cell region to the multi-level cell region in the third mode.

Example 29 includes a memory controller apparatus, comprising means for controlling access to a memory array which includes a single-level cell region and a multi-level cell region, means for determining an amount of valid data in a dynamic portion of the single-level cell region at runtime, and means for adjusting a size of the dynamic portion of the single-level cell region at runtime based on the determined amount of valid data in the dynamic portion of the single-level cell region.

Example 30 includes the apparatus of Example 29, further comprising means for increasing the size of the dynamic portion in a first mode, means for maintaining the size of the dynamic portion in a second mode, and means for decreasing the size of the dynamic portion in a third mode.

Example 31 includes the apparatus of Example 30, further comprising means for determining if a first condition is attained where a number of super blocks in the dynamic portion of the single-level cell region is equal to or greater than a first threshold, means for determining if a second condition is attained where an amount of mapped valid data in the dynamic portion of the single-level cell region is equal to or greater than a second threshold, and means for determining if a third condition is attained where a number of empty blocks in the multi-level cell region is equal to or less than a third threshold.

Example 32 includes the apparatus of Example 31, further comprising means for operating in the first mode when none of the first condition, the second condition, or the third condition is attained, means for operating in the second mode when either the first condition or the second condition is attained and the third condition is not attained, and means for operating in the third mode when the third condition is attained.

Example 33 includes the apparatus of any of Examples 30 to 32, further comprising means for writing all host data to the dynamic portion of the single-level cell region in the first mode.

Example 34 includes the apparatus of any of Examples 30 to 33, further comprising means for writing all host data to the dynamic portion of the single-level cell region in the second mode, and means for performing a background move of copies of previously written data from the dynamic portion of the single-level cell region to the multi-level cell region in the second mode.

Example 35 includes the apparatus of any of Examples 30 to 34, further comprising means for writing all host data to a static portion of the single-level cell region in the third mode, and means for performing a background move of copies of previously written data from both the static and dynamic portions of the single-level cell region to the multi-level cell region in the third mode.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   one or more substrates; and
   logic coupled to the one or more substrates, the logic to:
      control access to a memory array which includes a single-level cell region and a multi-level cell region,
      determine a total amount of valid data in a dynamic portion of the single-level cell region at runtime,
      adjust a size of the dynamic portion of the single-level cell region at runtime based on the determined total amount of valid data in the dynamic portion of the single-level cell region,
      increase the size of the dynamic portion in a first mode,
      maintain the size of the dynamic portion in a second mode,
      decrease the size of the dynamic portion in a third mode,
      determine if a first condition is attained where a number of super blocks in the dynamic portion of the single-level cell region is equal to or greater than a first threshold,
      determine if a second condition is attained where a total amount of mapped valid data in the dynamic portion of the single-level cell region is equal to or greater than a second threshold, and
      determine if a third condition is attained where a number of empty blocks in the multi-level cell region is equal to or less than a third threshold.

2. The apparatus of claim 1, wherein the logic is further to:
   operate in the first mode when none of the first condition, the second condition, or the third condition is attained;
   operate in the second mode when either the first condition or the second condition is attained and the third condition is not attained; and
   operate in the third mode when the third condition is attained.

3. The apparatus of claim 2, wherein the logic is further to:
   write all host data to the dynamic portion of the single-level cell region in the first mode.

4. The apparatus of claim 2, wherein the logic is further to:
write all host data to the dynamic portion of the single-level cell region in the second mode; and
perform a background move of copies of previously written data from the dynamic portion of the single-level cell region to the multi-level cell region in the second mode.

5. The apparatus of claim 2, wherein the logic is further to:
write all host data to a static portion of the single-level cell region in the third mode; and
perform a background move of copies of previously written data from both the static and dynamic portions of the single-level cell region to the multi-level cell region in the third mode.

6. A storage system, comprising:
a memory array including a single-level cell region and a multi-level cell region; and
a controller coupled to the memory array, the controller including logic to:
determine a total amount of valid data in a dynamic portion of the single-level cell region at runtime,
adjust a size of the dynamic portion of the single-level cell region at runtime based on the determined total amount of valid data in the dynamic portion of the single-level cell region,
increase the size of the dynamic portion in a first mode,
maintain the size of the dynamic portion in a second mode,
decrease the size of the dynamic portion in a third mode,
determine if a first condition is attained where a number of super blocks in the dynamic portion of the single-level cell region is equal to or greater than a first threshold,
determine if a second condition is attained where a total amount of mapped valid data in the dynamic portion of the single-level cell region is equal to or greater than a second threshold, and
determine if a third condition is attained where a number of empty blocks in the multi-level cell region is equal to or less than a third threshold.

7. The system of claim 6, wherein the logic is further to:
operate in the first mode when none of the first condition, the second condition, or the third condition is attained;
operate in the second mode when either the first condition or the second condition is attained and the third condition is not attained; and
operate in the third mode when the third condition is attained.

8. The system of claim 7, wherein the logic is further to:
write all host data to the dynamic portion of the single-level cell region in the first mode.

9. The system of claim 7, wherein the logic is further to:
write all host data to the dynamic portion of the single-level cell region in the second mode; and
perform a background move of copies of previously written data from the dynamic portion of the single-level cell region to the multi-level cell region in the second mode.

10. The system of claim 7, wherein the logic is further to:
write all host data to a static portion of the single-level cell region in the third mode; and
perform a background move of copies of previously written data from both the static and dynamic portions of the single-level cell region to the multi-level cell region in the third mode.

11. A method of controlling memory, comprising:
controlling access to a memory array which includes a single-level cell region and a multi-level cell region;
determining a total amount of valid data in a dynamic portion of the single-level cell region at runtime;
adjusting a size of the dynamic portion of the single-level cell region at runtime based on the determined total amount of valid data in the dynamic portion of the single-level cell region;
increasing the size of the dynamic portion in a first mode;
maintaining the size of the dynamic portion in a second mode;
decreasing the size of the dynamic portion in a third mode;
determining if a first condition is attained where a number of super blocks in the dynamic portion of the single-level cell region is equal to or greater than a first threshold;
determining if a second condition is attained where a total amount of mapped valid data in the dynamic portion of the single-level cell region is equal to or greater than a second threshold; and
determining if a third condition is attained where a number of empty blocks in the multi-level cell region is equal to or less than a third threshold.

12. The method of claim 11, further comprising:
operating in the first mode when none of the first condition, the second condition, or the third condition is attained;
operating in the second mode when either the first condition or the second condition is attained and the third condition is not attained; and
operating in the third mode when the third condition is attained.

13. The method of claim 12, further comprising:
writing all host data to the dynamic portion of the single-level cell region in the first mode.

14. The method of claim 12, further comprising:
writing all host data to the dynamic portion of the single-level cell region in the second mode;
performing a background move of copies of previously written data from the dynamic portion of the single-level cell region to the multi-level cell region in the second mode;
writing all host data to a static portion of the single-level cell region in the third mode; and
performing a background move of copies of previously written data from both the static and dynamic portions of the single-level cell region to the multi-level cell region in the third mode.

* * * * *